(12) United States Patent
Howard (10) Patent No.: US 10,175,104 B2
(45) Date of Patent: Jan. 8, 2019

(54) LIGHT SENSOR ASSEMBLY

(71) Applicant: TE CONNECTIVITY CORPORATION, Berwyn, PA (US)

(72) Inventor: Edward J. Howard, Millersburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 178 days.

(21) Appl. No.: 15/403,769

(22) Filed: Jan. 11, 2017

(65) Prior Publication Data

US 2018/0195899 A1   Jul. 12, 2018

(51) Int. Cl.
| | |
|---|---|
| *G01J 1/44* | (2006.01) |
| *G01J 1/42* | (2006.01) |
| *F21V 23/06* | (2006.01) |
| *H01R 12/58* | (2011.01) |
| *H01R 12/71* | (2011.01) |

(Continued)

(52) U.S. Cl.
CPC ............... *G01J 1/44* (2013.01); *F21V 23/06* (2013.01); *G01J 1/4204* (2013.01); *H01R 12/58* (2013.01); *H01R 12/718* (2013.01); *H01R 13/113* (2013.01); *F21V 23/004* (2013.01); *F21V 23/0464* (2013.01); *G01J 2001/4413* (2013.01);

(Continued)

(58) Field of Classification Search
CPC .... G01J 1/44; G01J 1/4204; G01J 2001/4413; F21V 23/06; F21V 23/0464; F21V 23/004; H01R 13/113; H01R 12/58; H01R 12/718; H01R 12/732; H01R 13/055; H01R 13/187

USPC .......................................................... 250/206
See application file for complete search history.

(56) References Cited

U.S. PATENT DOCUMENTS 4,477,143 A * 10/1984 Taylor .................. H01R 33/945
439/559
9,148,936 B2 * 9/2015 Wagner .............. H05B 37/0218
(Continued)

FOREIGN PATENT DOCUMENTS

EP    2 937 628 A1   10/2015
WO   97/24910 A1    7/1997

OTHER PUBLICATIONS

International Search Report, Application No. PCT/IB2017/058165, International Filing Date, dated Dec. 19, 2017.

*Primary Examiner* — Seung C Sohn (57) ABSTRACT

A light sensor assembly is provided including a base assembly configured to be fixedly mounted to a housing of a light fixture. The base assembly holds fixture contacts configured to be electrically connected to the light fixture. A photocell module is provided on the base assembly. The photocell module includes a control circuit board having an upper surface and a lower surface. The control board includes contact openings therethrough and conductors associated with corresponding openings. The photocell module has a photocell electrically connected to the control circuit board. Receptacle contacts are received in corresponding contact openings in the control board. Each receptacle contact has a socket removably receiving the corresponding fixture contact. Each receptacle contact has a mating interface electrically connected to the corresponding fixture contact. Each receptacle contact has a mounting beam terminated to the corresponding conductor of the control board. A cover is coupled to the base assembly over the photocell module.

20 Claims, 8 Drawing Sheets

(51) Int. Cl.
*H01R 13/11* (2006.01)
*F21V 23/00* (2015.01)
*F21V 23/04* (2006.01)
*H01R 12/73* (2011.01)
*H01R 13/05* (2006.01)
*H01R 13/187* (2006.01)

(52) U.S. Cl.
CPC .......... *H01R 12/732* (2013.01); *H01R 13/055* (2013.01); *H01R 13/187* (2013.01)

(56) References Cited

U.S. PATENT DOCUMENTS

| | | |
|---|---|---|
| 2005/0282430 A1 | 12/2005 | Hoxha |
| 2013/0044444 A1 | 2/2013 | Creighton et al. |
| 2016/0069547 A1 | 3/2016 | Chen |

\* cited by examiner

LIGHT SENSOR ASSEMBLY

BACKGROUND OF THE INVENTION

The subject matter herein relates generally to light sensor assemblies.

On outdoor lighting, notably street lights and parking lot lights, photocontrol components and the corresponding fixture contacts are typically used to turn the lights on and off based upon the ambient light from the sun. Some light fixtures support dimming to variably control the light fixture based on the ambient light levels during the day with dimming, signaling, and power contacts at an interface between a photocontrol printed circuit board and the light fixture. Currently, the photocontrol printed circuit boards utilize solder technology in order to electrically connect the fixture contacts of the light fixture to the photocontrol printed circuit boards. However, soldering the contacts to the photocontrol printed circuit boards is time consuming, labor intensive, and is not easily automated.

A need remains for a light sensor assembly that may be assembled in a cost effective and reliable manner.

BRIEF DESCRIPTION OF THE INVENTION

In one embodiment, a light sensor assembly is provided including a base assembly configured to be fixedly mounted to a housing of a light fixture. The base assembly holds fixture contacts configured to be electrically connected to the light fixture. A photocell module is provided on the base assembly. The photocell module includes a control circuit board having an upper surface and a lower surface. The control circuit board includes contact openings therethrough and conductors associated with corresponding openings. The photocell module has a photocell electrically connected to the control circuit board. Receptacle contacts are received in corresponding contact openings in the control circuit board. Each receptacle contact has a socket removably receiving the corresponding fixture contact. Each receptacle contact has a mating interface electrically connected to the corresponding fixture contact. Each receptacle contact has a mounting beam terminated to the corresponding conductor of the control circuit board. A cover is coupled to the base assembly over the photocell module.

In another embodiment, a light sensor assembly is provided including a base assembly configured to be fixedly mounted to a housing of a light fixture. The base assembly holds fixture contacts configured to be electrically connected to the light fixture. The fixture contacts have mating ends and terminating ends opposite the mating ends. The terminating ends are configured to be terminated to electrical components of the light fixture. A photocell module is provided on the base assembly. The photocell module includes a control circuit board having an upper surface and a lower surface. The control circuit board has contact openings therethrough and conductors associated with corresponding openings. The conductors have solder pads on the control circuit board. The photocell module has a photocell electrically connected to the control circuit board. Receptacle contacts are received in corresponding contact openings in the control circuit board. Each receptacle contact has a socket removably receiving the corresponding fixture contact. Each receptacle contact has a mating interface electrically connected to the corresponding fixture contact. Each receptacle contact has a mounting beam terminated to the corresponding conductor of the control circuit board. A cover is coupled to the base assembly over the photocell module.

In a further embodiment, a light sensor assembly is provided including a base assembly configured to be fixedly mounted to a housing of a light fixture. The base assembly holds fixture contacts configured to be electrically connected to the light fixture. The fixture contacts have mating ends and terminating ends opposite the mating ends. The terminating ends are configured to be terminated to electrical components of the light fixture. At least one of the fixture contacts is a twist-lock power contact. The twist-lock power contact has a non-planar surface at the terminating end configured to be rotatably mounted to the light fixture. A photocell module is provided on the base assembly. The photocell module includes a control circuit board having an upper surface and a lower surface. The control circuit board has contact openings therethrough and conductors associated with corresponding openings. The conductors have solder pads on the control circuit board. The photocell module has a photocell electrically connected to the control circuit board. Receptacle contacts are received in corresponding contact openings in the control circuit board. Each receptacle contact has a socket removably receiving the corresponding fixture contact. Each receptacle contact has a mating interface electrically connected to the corresponding fixture contact. Each receptacle contact has a mounting beam terminated to the corresponding conductor of the control circuit board. A cover is coupled to the base assembly over the photocell module.

DETAILED DESCRIPTION OF THE INVENTION

Figure 1:
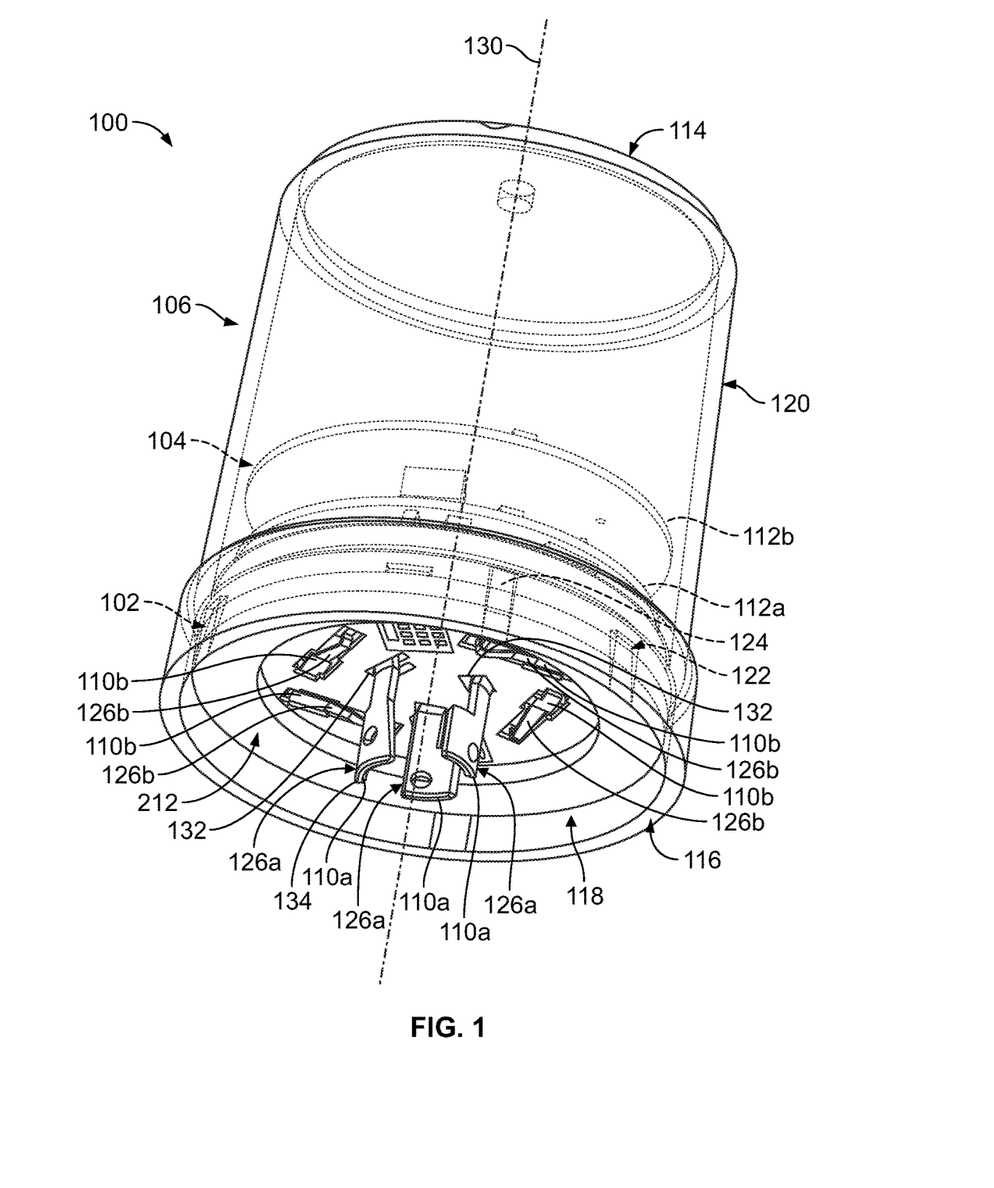
FIG. 1 illustrates a light sensor assembly formed in accordance with an embodiment.

FIG. 1 illustrates a light sensor assembly 100 formed in accordance with an embodiment. The light sensor assembly 100 includes a base assembly 102 that is fixedly mounted to a light fixture (not shown), such as a roadway light, a parking lot light, a street light, or the like. The base assembly 102 forms the bottom mating surface of the assembly 100, which may be mated to a receptacle or other connector that is fixedly mounted to the assembly 100.

The light sensor assembly 100 includes a photocell module 104 that is mounted to the base assembly 102. The photocell module 104 includes one or more photocells 230 (shown in FIG. 2) that is/are used to turn the light fixture on or off depending upon light levels. The photocell 230 is a light sensor used to detect ambient light from the sun. For proper operation, it is desirable that the light sensor assembly 100 be aimed in a particular direction, such as facing north, to receive the most diffuse ambient light for efficient operation of the light sensor assembly 100. The light sensor assembly 100 is rotatable about a central axis 130 to allow aiming of the light sensor assembly 100 in the desired direction.

The light sensor assembly 100 includes a cover 106 fixedly coupled to the base assembly 102. The cover 106 houses or surrounds the photocell module 104, such as to provide environmental protection to the photocell module 104. The photocell module 104 is contained within a cover cavity 118 that is defined by one or more cover sidewalls 120 and extends along the central axis 130 between a cover top 114 and a cover bottom 116. For example, the photocell module 104, mounted to the base assembly 102, extends within the cover cavity 118 at a position between the cover top 114 and the base assembly 102 near the cover bottom 116 along the central axis 130.

The cover 106 is locked in a position relative to the base assembly 102 to maintain a position of the cover 106. For example, the cover 106 and/or base assembly 102 may include one or more locking features 122, 124 to lock the angular and/or axial position of the cover 106 relative to the base assembly 102. The cover 106 may be unlocked from the base assembly 102 to change the angular position of the cover 106 relative to the base assembly 102 and then the cover 106 may again be locked in position relative to the base assembly 102.

The photocell module 104 includes one or more control circuit boards 112. In the illustrated embodiment, two control circuit boards are illustrated 112a, 112b. Optionally any number of control boards 112 may be present. The photocell 230 is electrically connected to the control circuit board 112.

The base assembly 102 includes contact openings 132 that are passages between a top surface 210 of the base assembly (shown in FIG. 2) and a bottom surface 212 of the base assembly 102. Optionally, the bottom surface 212 of the base assembly may be an interfacial foam seal gasket. Optionally, the bottom surface 212 may be any material that forms a seal at the bottom of the base assembly 102. The base assembly 102 holds fixture contacts 110 within the contact openings 132 that are configured to be electrically connected to the light fixture. The fixture contacts 110 extend downward from the bottom surface 212 of the base assembly 102 and are arranged generally around the central axis 130. The fixture contacts 110 are configured to be plugged The fixture contacts 110 include terminating ends 126 and mating ends 228 (shown in FIG. 2). The terminating ends 126 are configured to be terminated in a light fixture (not shown) when the base assembly 102 is mounted to the light fixture. For example, the terminating ends 126 protrude from the bottom surface 212 of the base assembly in a direction away from the bottom surface 212 and are configured to be terminated to electrical components of the light fixture. The terminating ends 126 may be terminated to mating contacts within the fixture, such as by an interference connection. Alternatively, the terminating ends 126 may be terminated to wires, such as power wires, by a crimp connection, a solder connection, or the like. In an embodiment, the base assembly 102 may be twisted or rotated to lock the fixture contacts 110 into the light fixture. For example, the fixture contacts 110 may be twist-lock power contacts 110a that are initially loaded into openings in a vertical direction along the central axis 130 and the base assembly 102 is then rotated, such as approximately 35 degrees, to lock the fixture contacts 110 in the light fixture in electrical contact with the mating contacts. The twist-lock power fixture contact 110a includes a non-planar surface 134 at the terminating end 126a that is rotatably mounted to the light fixture.

Figure 2:
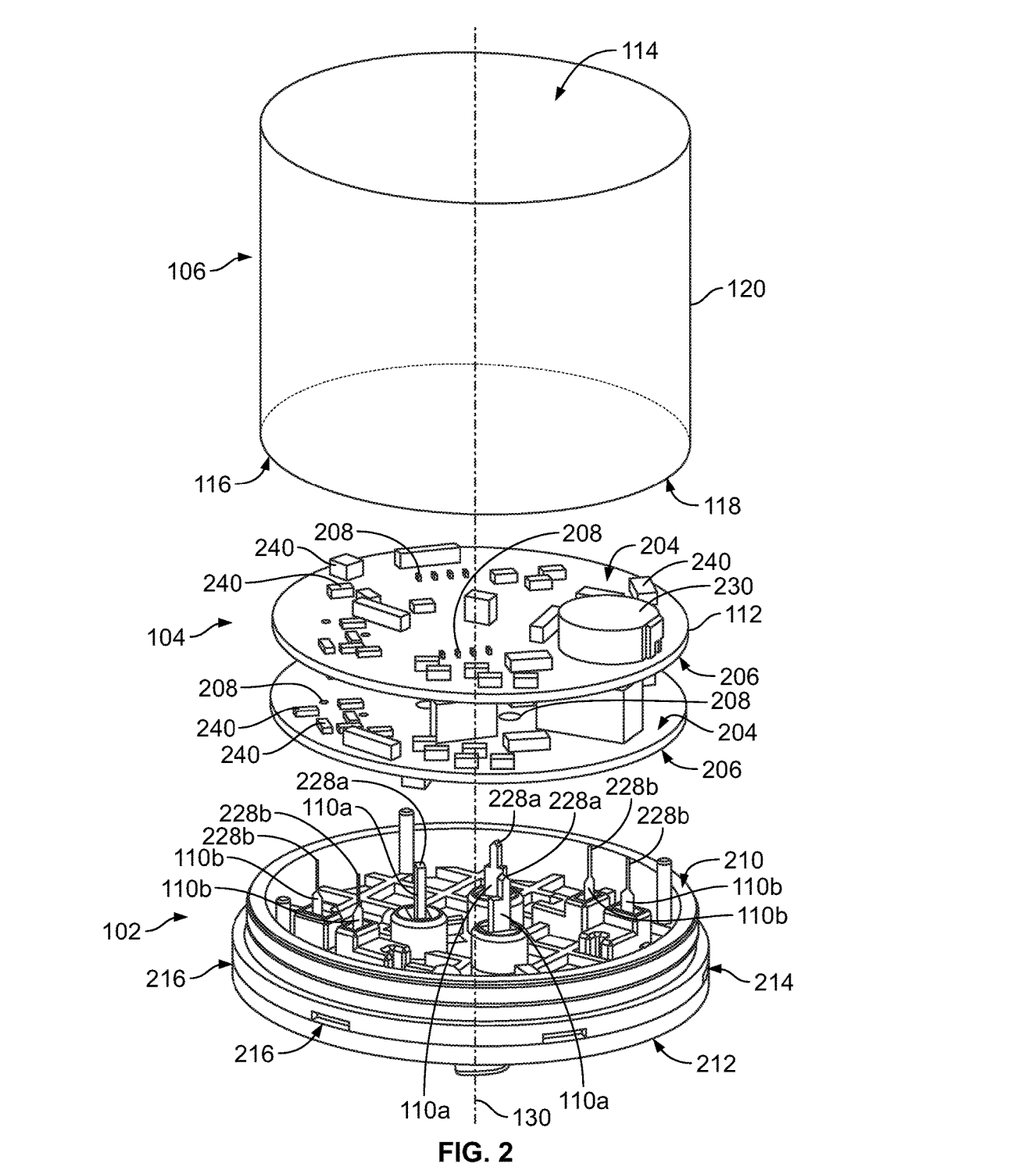
FIG. 2 is an exploded view of the light sensor assembly of FIG. 1 formed in accordance with an embodiment.

The mating ends 228 of the fixture contacts 110 extend from the top surface 210 of the base assembly 102 and are configured to be electrically connected with one or more electrical components of the control circuit board 112 inside of the cavity 118 of the cover 106. For example, the mating ends 228 may be electrically connected to one or more capacitors, resistors, batteries, photocells 230, or any other electrical components included with the control circuit board 112. The electrical connection between the mating ends 228 of the fixture contacts 110 and the control circuit boards 112 will be described in more detail below.

The fixture contacts 110 may be one or more of power contacts, signal contacts, or the like. For example, the fixture contacts 110 may be ANSI C136.x compliant. In the illustrated embodiment, three twist-lock power contacts 110a and four signal contacts 110b are included in the sensor assembly 100. Optionally, one or more twist-lock power contacts, one or more dimming signal contacts, or an alternative contact may be included within the sensor assembly 100. The signal contacts 110b may be used for transferring data across the interfaces, such as between the light fixture and the assembly 100. For example, the data may relate to dimming control. Such contacts may be dimming signal contacts.

FIG. 2 is an exploded view of the light sensor assembly 100 formed in accordance with an embodiment. The base assembly 102 includes the top surface 210 and the interfacial foam seal gasket bottom surface 212 with a side surface 214 between the top surface 210 and bottom surface 212. In the illustrated embodiment, the base assembly 102 is generally circular about the central axis 130. Optionally, the base assembly 102 may have any alternative shape and/or size. The base assembly 102 includes one or more base securing features 216. For example, the base may include a clip or flange to secure the cover 106 to the base assembly 102. The securing feature 216 may be provided at one or more locations around the base assembly 102. The securing feature 216 may allow rotation of the cover 106 relative to the base assembly 102 when engaged. Optionally, any other fastening methods that secure the cover 106 to the base assembly 102 may be employed.

The photocell module 104 includes control circuit boards 112a, 112b. Each control circuit board 112 includes an upper surface 204 and a lower surface 206. For example, when the light sensor assembly 100 is assembled, the lower surface 206 of the control circuit board 112 is disposed closer to the top surface 210 of the base assembly than the cover top 114.

The control circuit board 112 includes one or more electrical components 240 disposed on one or more of the upper or lower surfaces 204, 206 of the control circuit board 112. The one or more components 240 and the photocell 230 are electrically connected via the circuit board 112. For example, the control circuit boards 112 may have control circuitry for controlling operation of the light fixture, such as including a daylight or nighttime control circuit, a timer circuit, a dimming circuit, and the like. In other alternative embodiments, the one or more electrical components 240 may be connected to the photocell 230 via wires.

The control circuit boards 112 include one or more contact openings 208. The contact openings 208 are passages that extend between and are open to the upper surface 204 and the lower surface 206 of the circuit board 112. The contact openings 208 include corresponding conductors (shown in FIG. 4) associated with each corresponding opening 208.

The mating ends 228a, 228b of the fixture contacts 110a, 110b are aligned with corresponding contact openings 208 of the control circuit board 112. For example, the mating ends 228a, 228b extend through the passage of the contact openings 208 in order to be electrically connected to one or more of the electrical components 240 of the control circuit board 112. For example, the control circuit board 112 includes receptacle contacts configured to receive and electrically connect to the corresponding fixture contact 110.

Figure 3A:
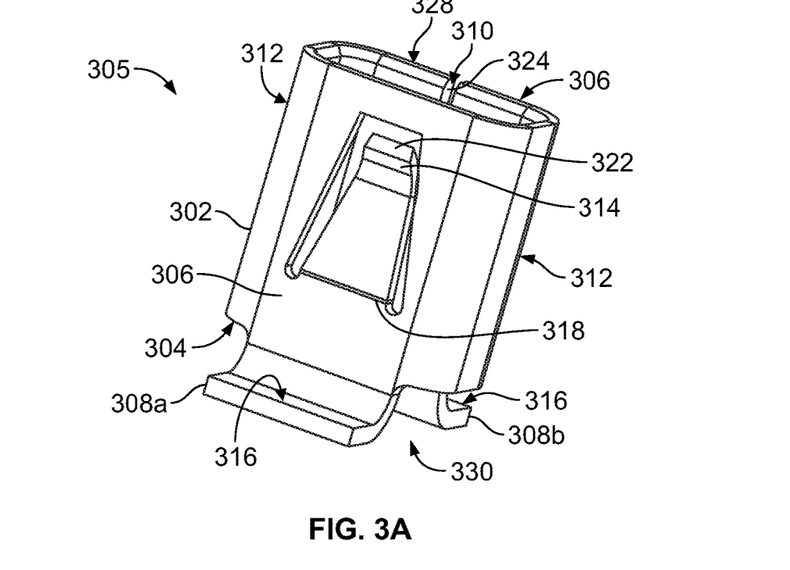
FIG. 3A is a perspective view of a receptacle contact formed in accordance with an embodiment.
Figure 3B:
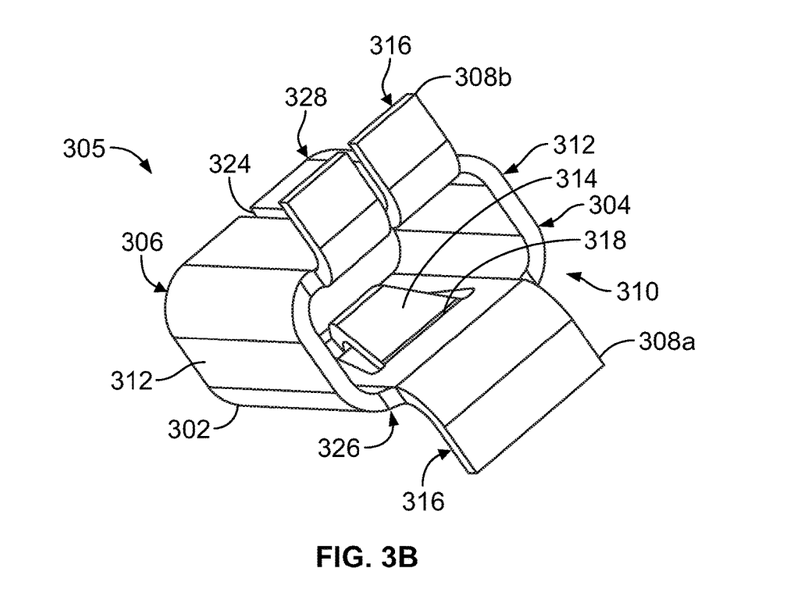
FIG. 3B is a perspective view of the receptacle contact of FIG. 3A formed in accordance with an embodiment.
Figure 4:
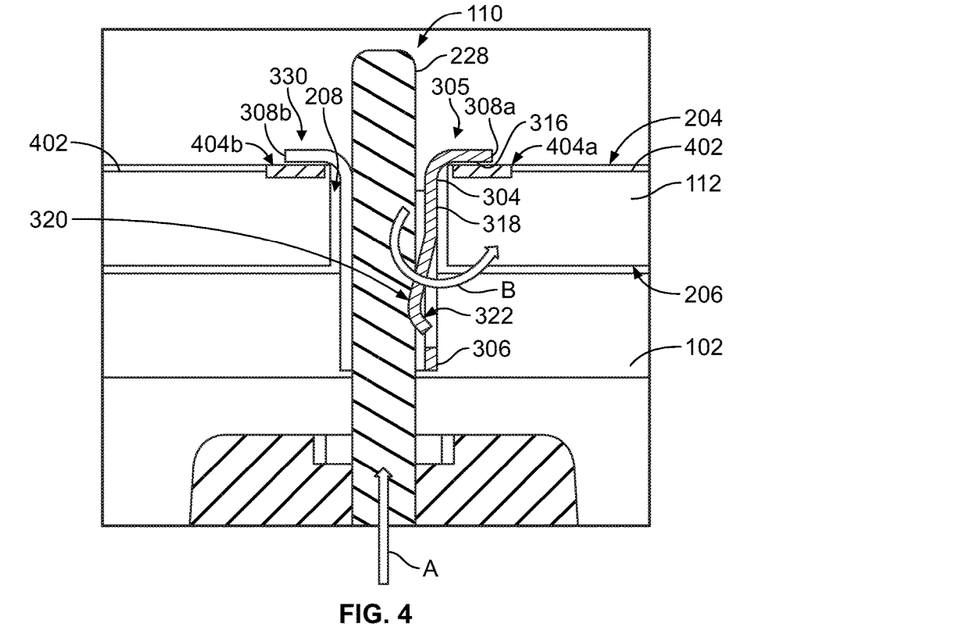
FIG. 4 is a cross-sectional view of the receptacle contact of FIG. 3A fixedly mounted to a control circuit board in accordance with an embodiment.

FIGS. 3A and 3B illustrate a receptacle contact 305 formed in accordance with an embodiment. FIG. 4 illustrates a cross-sectional view of the receptacle contact 305 received in the contact opening 208 of the control circuit board 112. FIGS. 3A, 3B and 4 will be discussed in detail together.

The receptacle contact 305 is a single, unitary component manufactured of a conductive material. For example, the receptacle contact 305 may be stamped and formed from a conductive (e.g., metal) coil strip or panel. Alternatively, the receptacle contact 305 may be formed in any alternative method and/or may be formed of one or more components.

The receptacle contact 305 includes a body 302 including end walls 304, 306 and one or more sidewalls 312. The end walls 304, 306 and the sidewalls 312 define a socket 310 that is a passage between the end walls 304, 306. The body 302 of the receptacle contact 305 is shaped and/or size in order to be received in the corresponding contact openings 208 of the control circuit board 112, and to removably receive the mating end 228 of the fixture contact 110. For example, the receptacle contact 305 is shaped and/or sized to electrically connect the fixture contacts 110 with the control circuit board 112.

The receptacle contact 305 includes one or more mounting beams 308 extending away from the end wall 304 in a direction generally away from the body 302. For example, the mounting beams 308 extend outward away from the socket 310. Optionally, one or more of the mounting beams 308 may extend from any combination of sidewalls 312, the end wall 304, or the end wall 306. For example, the receptacle contact 305 may include two or more mounting beams 308 or less than two mounting beams 308 extending from one or more of the end walls 304, 306 and/or sidewalls 312. The mounting beams 308 include mounting surfaces 316. In the illustrated embodiment, the mounting beams 308 and the mounting surfaces 316 extend generally perpendicular to the sidewalls 312. Optionally, the mounting beams 308 and the mounting surfaces 316 may be non-perpendicular to the sidewalls 312. For example, the mounting beams 308 may extend from the body 302 of the receptacle contact 305 in any radial direction.

In the illustrated embodiment of FIG. 4, conductor 402 is provided on the upper surface 204 of the control circuit board 112. The mounting beams 308, extending from a top 330 of the receptacle contact 305, are configured to be terminated to the corresponding conductor 402 on the upper surface 204 of the control circuit board 112. The receptacle contact 305 is fixedly mounted to the control circuit board 112 by soldering the mounting surfaces 316 of the mounting beams 308 to corresponding solder pads 404. For example, the mounting beam 308a is a first mounting beam and the mounting beam 308b is a second mounting beam. The mounting beams 308a, 308b are terminated to the corresponding solder pads 404a, 404b. Either or both of the solder pads 404a, 404b may be electrically connected to the corresponding connector 402. Alternatively, one or more mounting beams 308 may be terminated to one or more conductors 402 provided on the lower surface 206 of the control circuit board 112.

The receptacle contact 305 includes a mating beam 314 having a mating interface 320. In the illustrated embodiment, the receptacle contact 305 includes one mating beam 314. Optionally, the receptacle contact may include any number of mating beams 314. The mating beam 314 includes a fixed end 318 and a flexed end 322. The fixed end 318 is disposed closer to the end wall 304 than the flexed end 322. Alternatively, the fixed end 318 may be disposed closer to the end wall 306 than the flexed end 322. The mating beam 314 is biased to protrude into the socket 310 of the receptacle contact 305 when the mating beam 314 is in a relaxed state. For example, the flexed end 322 of the mating beam 314 extends into the socket 310 a distance away from the body 302 of the receptacle contact 305 when the mating beam 314 is in a resting state.

The receptacle contact 305, received in the corresponding contact opening 208 of the control circuit board 112, removably receives the mating end 228 of the corresponding fixture contact 110. For example, the receptacle contact 305, joined to the control circuit board 112 receives the fixture contact 110 within the socket 310 when the photocell module 104 is joined to the base assembly 102. The receptacle contact 305 is electrically connected to the mating end 228 of the fixture contact 110 by the mating interface 320 of the mating beam 314. For example, when the mating end 228 of the fixture contact transfers into the socket 310 of the receptacle contact 305 in a direction A from the end wall 306 towards the end wall 304, the mating end 228 interferes with the mating interface 320 of the mating beam 314 such that the mating end 228 moves the mating beam 314 towards the body 302 of the receptacle contact 305. For example, the mating beam 314 flexes in a radial direction B towards the body 302 when the fixture contact 110 is received within the socket 310 of the receptacle contact 305. Additionally, when the mating end 228 is removed from the receptacle contact 305 (e.g., in a direction opposite the direction A), the mating beam 314 rotates in a direction opposite the radial direction B and returns to the relaxed, resting state.

The receptacle contact 305 includes a solder joint seam 324 that transverses the body 302 of the receptacle contact 305 between the end walls 304, 306 on the sidewall 312 opposite the mating beam 314. For example, the mating beam 314 is disposed on a first side 326 of the body 302, and the solder joint seam 324 is disposed on a second side 328 of the body 302. The solder joint seam 324 maintains a shape of the receptacle contact 305. Alternatively, the receptacle contact 305 may include an alternative locking style seam. For example, the shape of the formed receptacle contact 305 may be maintained by a puzzle locking joint, a keyed joint, a locking flange, or any alternative locking mechanism.

Figure 5:
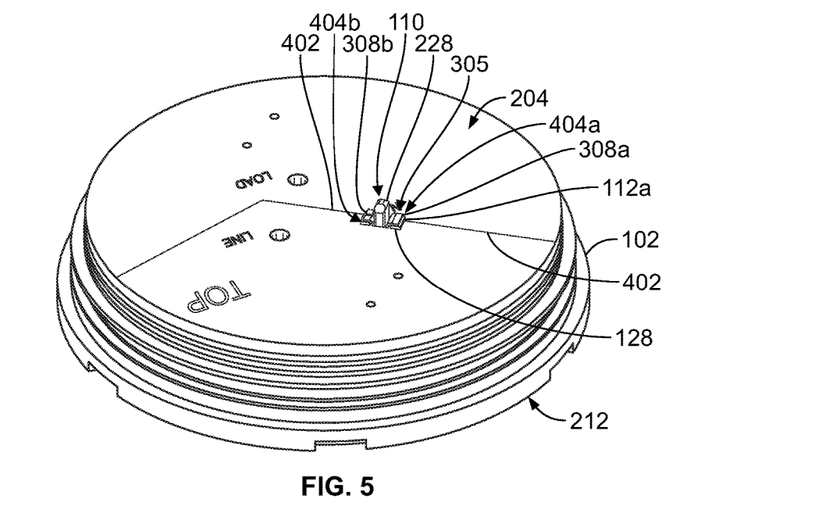
FIG. 5 is a perspective view of the receptacle contact of FIG. 3A fixedly mounted to a control circuit board in accordance with an embodiment.

FIG. 5 illustrates a perspective view of the receptacle contact 305 joined to the control circuit board 312 within the contact opening 128. The conductor 402 is provided on the upper surface 204 of the control circuit board The first and second mounting beams 308a, 308b are electrically terminated to the corresponding solder pads 404a, 404b adjacent to contact opening 128 such that the first and second mounting beams 308a, 308b are electrically connected to the corresponding conductor 402.

The mating end 228 of the fixture contact 110 is removably received within the socket 310 of the receptacle contact 305. The fixture contact 110 extends from the terminating end 126 protruding from the bottom surface 212 of the base assembly 102 (shown in FIG. 1) to the mating end 228 that extends through the socket 310 of the receptacle contact 305 such that the mating end 228 protrudes from the upper surface 204 of the control circuit board 112. For example, the mating interface 320 of the receptacle contact 305, in contact with the mating end 228 of the fixture contact 110, electrically connects the fixture contact 110 to the conductor 402.

Figure 6A:
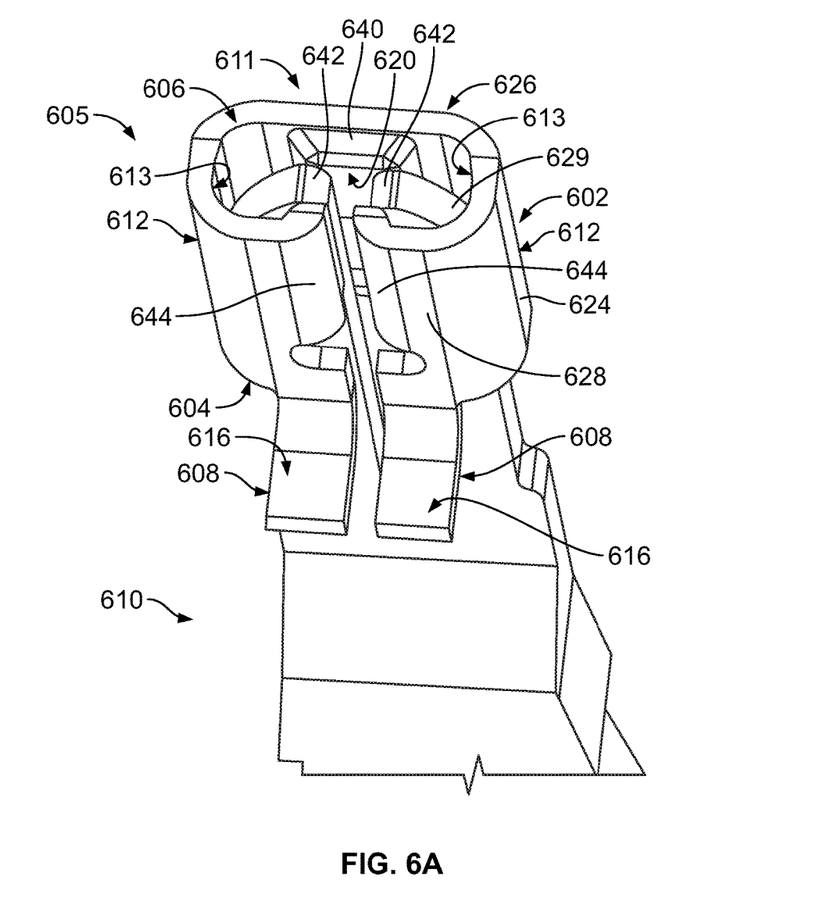
FIG. 6A is a perspective view of a receptacle contact formed in accordance with an embodiment.
Figure 6B:
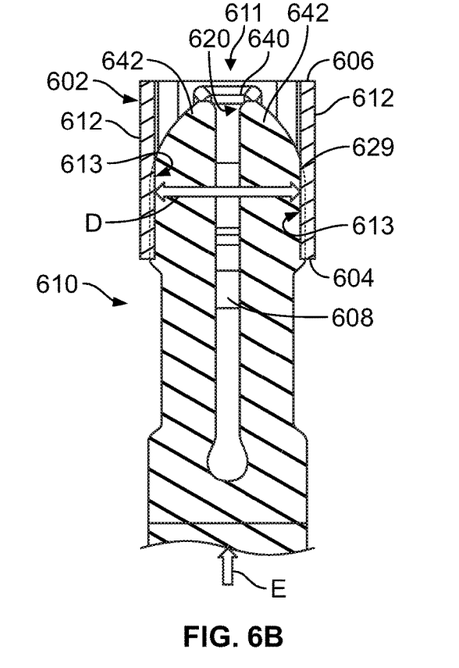
FIG. 6B is a cross-sectional view of a fixture contact received within the receptacle contact of FIG. 6A in accordance with an embodiment.
Figure 6C:
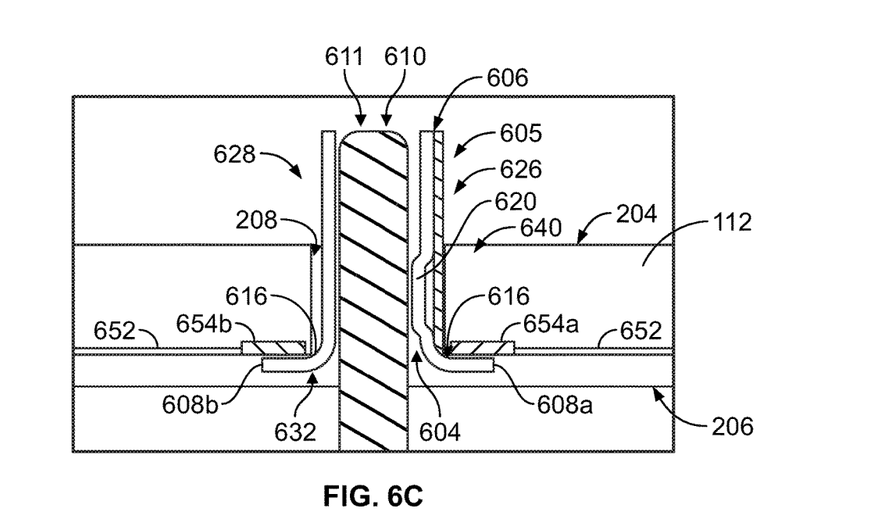
FIG. 6C is a cross-sectional view of the receptacle contact of FIG. 6A fixedly mounted to a control circuit board in accordance with an embodiment.

FIG. 6A illustrates a perspective view of a mating end 629 of a fixture contact 610 received within a receptacle contact 605. FIG. 6B illustrates a cross-sectional view of the fixture contact 610 received within the receptacle contact 605. FIG. 6C illustrates an alternative cross-sectional view of the fixture contact 610 received within the receptacle contact 605. FIGS. 6A, 6B and 6C will discussed together in more detail.

The receptacle contact 605 is a single, unitary component manufactured of a conductive material. For example, the receptacle contact 605 may be stamped and formed from a conductive (e.g., metal) coil strip or panel. Alternatively, the receptacle contact 605 may be formed in any alternative method and/or may be formed of one or more components.

The receptacle contact 605 includes a body 602 including end walls 604, 606 and one or more sidewalls 612. The end walls 604, 606 and the sidewalls 612 define a socket 611 that is a passage between the end walls 604, 606. The body 602 is received within a corresponding contact opening 208 (shown in FIG. 2) of the control circuit board 112. The body 602 of the receptacle contact 605 is shaped and/or size in order to be received in the corresponding contact openings 208 of the control circuit board 112, and to removably receive the mating end 228 of the fixture contact 110. For example, the receptacle contact 605 is shaped and/or sized to electrically connect the fixture contacts 110 with the control circuit board 112.

The receptacle contact 605 includes one or more mounting beams 608 extending from the end wall 604 in a direction generally away from the body 602. For example, the mounting beam 608 extends outward away from the socket 611. Optionally, one or more mounting beams 608 may extend from any combination of sidewalls 612, the end wall 604, or the end wall 606. For example, the receptacle contact 605 may include two or more mounting beams 608 or less than two mounting beams 608 extending from one or more of the end walls 604, 606, and/or the sidewalls 612. The mounting beams 608 include mounting surfaces 616. The mounting beams 608 and the mounting surfaces 616 are generally perpendicular to the sidewalls 612. Optionally, the mounting beams 608 and the mounting surfaces 616 may be non-perpendicular to the sidewalls 612. For example, the mounting beams 608 may extend from the body 602 of the receptacle contact 605 in any radial direction.

In the illustrated embodiment of FIG. 6C, conductor 652 is provided on the lower surface 206 of the control circuit board 112. The mounting beams 608, extending from a bottom 632 of the receptacle contact 605, are configured to be terminated to the corresponding conductor 652 on the lower surface 206 of the control circuit board 112. For example, the receptacle contact 605 may be fixedly mounted to the control circuit board 112 by soldering the mounting surfaces 616 of the mounting beams 608 to the corresponding solder pads 654. For example, the mounting beam 608a is a first mounting beam and the mounting beam 608b is a second mounting beam. The mounting beams 608a, 608b are terminated to the corresponding solder pads 654a, 654b adjacent to the corresponding conductor 652. Alternatively, one or more mounting beams 608 may be terminated to one or more conductors 652 provided on the upper surface 204 of the control circuit board 112.

The receptacle contact 605 includes a protrusion 640 having a mating interface 620. The mating interface 620 of the protrusion 640 extends into the socket 611 in a direction away from the sidewall 612. In the illustrated embodiment, the receptacle contact 605 includes one protrusion 640. Optionally, the receptacle contact may include any number of protrusions. The protrusion 640 transverses the body 602 of the receptacle contact 605 between the end walls 604, 606 on a sidewall 612. Additionally or alternatively, the protrusion 640 may transverse the body between sidewalls 612. The mating interface 620 of the protrusion 640 is positioned within the contact opening 208 of the control circuit board 112 between the upper and lower surfaces 204, 206. For example, the receptacle contact 605 is electrically connected to the fixture contact 610 within the contact opening 208 of the circuit board 112.

The mating end 629 of the fixture contact 610 includes split beams 642. The split beams 642 are shaped and/or sized to exert a normal force D onto interior surfaces 613 of the receptacle contact 605 when the split beams 642 are inserted into the socket 611 of the receptacle contact 605. For example, the normal force D between the interior surfaces 613 and the split beams 642 maintains a position of the mating end 629 of the fixture contact 610 with respect to the receptacle contact 605.

The receptacle contact 605, received in the corresponding contact opening 208 of the control circuit board 112, removably receives the mating end 629 of the corresponding fixture contact 610. The receptacle contact 605 is electrically connected to the mating end 629 of the fixture contact 610 by one or more of the mating interface 620 of the protrusion 640 or the interior surface 613 in physical contact with the mating end 629. For example, when the mating end 629 of the fixture contact 610 transfers into the socket 611 of the receptacle contact 605 in a direction E from the end wall 604 to the end wall 606, the mating end 629 interferes with one or more of the mating interface 620 or the interior surfaces 613.

The receptacle contact 605 includes tabs 644 forming a seam 624 on the sidewall 612 opposite the protrusion 640. For example, the tabs 644 forming the seam 624 are disposed on a first side 628 of the body 602, and the protrusion 640 is disposed on a second side 626 of the body 602. The protrusion 640 and/or the tabs 644 one or more of guide or locate the mating end 629 of the fixture contact 610 within the socket 611 of the receptacle contact 605.

Figure 7A:
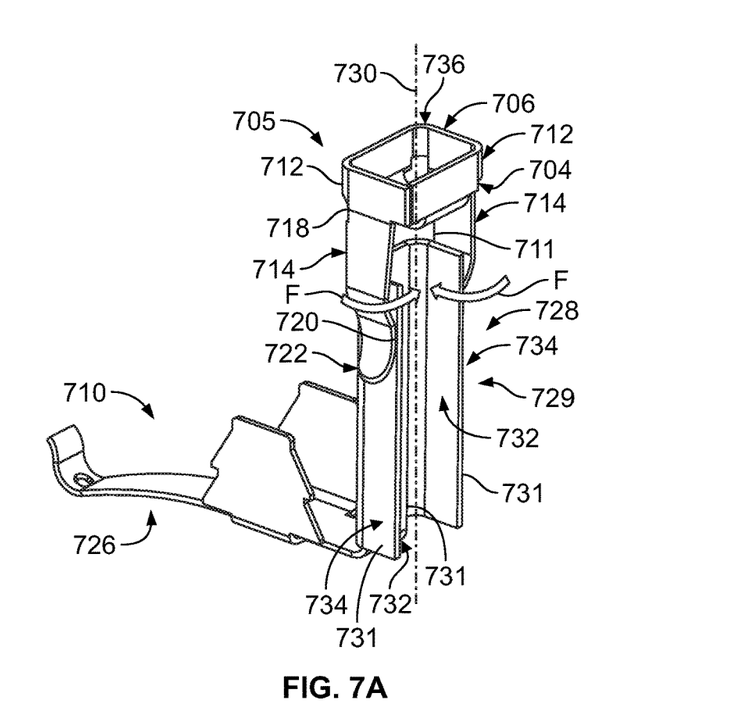
FIG. 7A is a perspective view of a receptacle contact and a fixture contact in accordance with an embodiment.
Figure 7B:
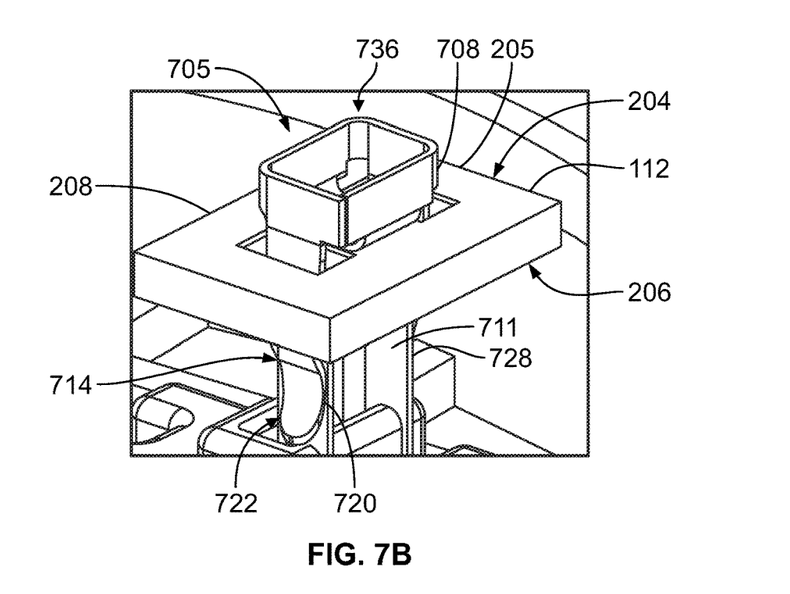
FIG. 7B is a perspective view of the receptacle contact and fixture contact of FIG. 7A received in a control circuit board in accordance with an embodiment.

FIGS. 7A and 7B illustrate perspective views of a receptacle contact 705 formed in accordance with an embodiment. The receptacle contact 705 is a single, unitary component manufactured of a conductive material. For example, the receptacle contact 705 may be stamped and formed from a conductive coil strip or panel. Alternatively, the receptacle contact 705 may be formed in any alternative method and/or may be formed of one or more components.

The receptacle contact 705 includes a body 702 including end walls 704, 706 and one or more sidewalls 712. The end walls 704, 706 and the sidewalls 712 define a cavity 736 that is a passage between the end walls 704, 706. The receptacle contact 705 includes one or more mounting beams 708 extending from the end wall 704 in a direction generally away from the body 702 within the cavity 736. For example, the mounting beams 708 extend within the cavity 736. Optionally, one or more of the mounting beams 708 may extend from any combination of sidewalls 712, the end wall 704, or the end wall 706. For example, the receptacle contact 705 may include two or more mounting beams 708 or less than two mounting beams 708 extending from one or more of the end walls 704, 706 and/or sidewalls 712. The mounting beams 708 include mounting surfaces (not shown). The mounting beams 708 and the mounting surfaces extend generally perpendicular to the sidewalls 712. Optionally, the mounting beams 708 and the mounting surfaces may be non-perpendicular to the sidewalls 712. For example, the mounting beams 708 may extend from the body 702 in any angular direction.

The receptacle contact 705 includes mating beams 714 having mating interfaces 720. The mating beams 714 define a socket 711 that extends between the mating beams 714. In the illustrated embodiment, the receptacle contact 705 includes two mating beams 714. Optionally, any number of mating beams 714 may be present. The mating beams 714 includes fixed ends 718 and flexed ends 722. The mating beams 714 extend from the end wall 704 in a direction generally away from the body 702. For example, the mating beams 714 are generally planar with the sidewalls 712. The mating beams 714 are biased in a radial direction F towards a central axis 730 when the mating beams 714 are in a relaxed state. For example, the mating beams 714 are biased in a direction generally towards the socket 711 of the receptacle contact 705.

The mating beams 714 are received within corresponding contact openings 208 of the control circuit board 112 when the receptacle contact 705 is fixedly mounted to the control circuit board 112. For example, the mounting beams 708 are terminated to a corresponding conductor (not shown) on the upper surface 204 of the control circuit board 112 such that the cavity 736 of the receptacle contact 705 is disposed on the upper surface 204 of the control circuit board 112. The mating beams 714, extending in a direction away from the end wall 704, are received within the corresponding contact openings 208 of the control circuit board 112 such that the mating beams extend below the lower surface 206 of the control circuit board 112. For example, the mating interfaces 720 of the mating beams 714 are positioned below the lower surface 206 of the control circuit board 112.

The socket 711 of the receptacle contact 705 receives a fixture contact 710. The fixture contact 710 includes a mating end 728 and a terminating end 726. The mating end 728 of the fixture contact 710 has a body 729 including sidewalls 731 having interior surfaces 732 and exterior surfaces 734. In the illustrated embodiment, the body 729 includes three sidewalls 731 formed as a single, unitary component. Alternatively, the sidewalls 731 may be discreet components.

The receptacle contact 705 is electrically connected to the mating end 728 of a fixture contact 710 by the mating interfaces 720 of the mating beams 714 interfering with the exterior surfaces 734 of the mating end 728. The mating end 728 moves the mating beams 714 such that the exterior surfaces 734 of the mating end 728 flex the mating beams 714 in a direction opposite the radial direction F when the receptacle contact 705 receives the fixture contact 710. For example, the exterior surfaces 734 move (e.g., transfer) the mating beams 714 away from each other when the receptacle contact 705 receives the fixture contact 710. Additionally, when the mating end 728 of the fixture contact 710 is removed from the receptacle contact 705, the mating beams 714 rotate in the radial direction F and return to the relaxed state.

Figure 8A:
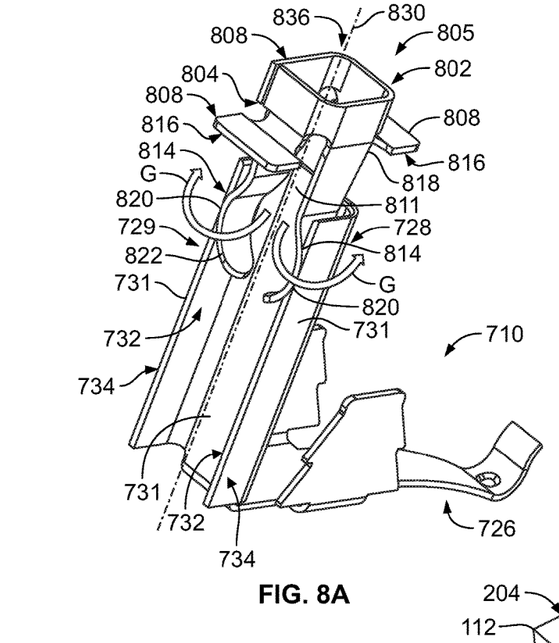
FIG. 8A is a perspective view of a receptacle contact and a fixture contact in accordance with an embodiment.
Figure 8B:
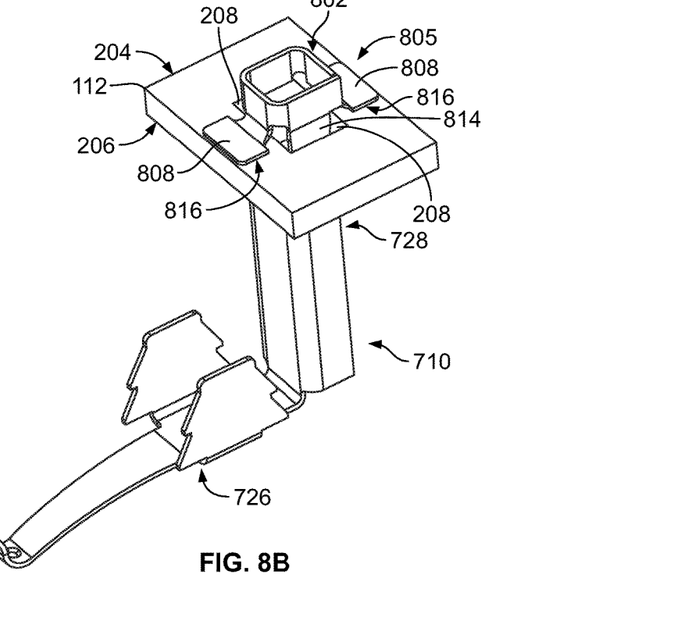
FIG. 8B is a perspective view of the receptacle contact and fixture contact of FIG. 8A received in a control circuit board in accordance with an embodiment.

FIGS. 8A and 8B illustrate perspective views of a receptacle contact 805 formed in accordance with an embodiment. The receptacle contact 805 is a single, unitary component manufactured of a conductive material. For example, the receptacle contact 805 may be stamped and formed from a conductive coil strip or panel. Alternatively, the receptacle contact 805 may be formed in any alternative method and/or may be formed of one or more components.

The receptacle contact 805 includes a body 802 including end walls 804, 806 and one or more sidewalls 812. The end walls 804, 806 and the sidewalls 812 define a cavity 836 that is a passage between the end walls 804, 806. The receptacle contact 805 includes one or more mounting beams 808 extending away from the end wall 804 in a direction generally away from the body 802 outside of the cavity 836. For example, the mounting beams 808 extend outside away from the cavity 836. Optionally, one or more of the mounting beams 808 may extend from any combination of sidewalls 812, the end wall 804, or the end wall 806. For example, the receptacle contact 805 may include two or more mounting beams 808 or less than two mounting beams 808 extending from one or more of the end walls 804, 806 and/or sidewalls 812. The mounting beams 808 include mounting surfaces (not shown). The mounting beams 808 and the mounting surfaces extend generally perpendicular to the sidewalls 812. Optionally, the mounting beams 808 and the mounting surfaces may be non-perpendicular to the sidewalls 812. For example, the mounting beams 808 may extend from the body 802 in any angular direction.

The receptacle contact 805 includes mating beams 814 having mating interfaces 820. The mating beams 814 define a socket 811 that extends between the mating beams 814. In the illustrated embodiment, the receptacle contact 805 includes two mating beams 814. Optionally, any number of mating beams 814 may be present. The mating beams 814 includes fixed ends 818 and flexed ends 822. The mating beams 814 extend from the end wall 804 in a direction generally away from the body 802. For example, the mating beams 814 are generally planar with the sidewalls 812. The mating beams 814 are biased in a radial direction G in a direction away from a central axis 830 when the mating beams 814 are in a relaxed state. For example, the mating beams 814 are biased in a direction generally away from the socket 811 of the receptacle contact 805.

The mating beams 814 are received within corresponding contact openings 208 of the control circuit board 112 when the receptacle contact 805 is fixedly mounted to the control circuit board 112. For example, the mounting beams 808 are terminated to a corresponding conductor (not shown) on the upper surface 204 of the control circuit board 112 such that the cavity 836 of the receptacle contact 805 is disposed on the upper surface 204 of the control circuit board 112. The mating beams 814, extending in a direction away from the end wall 804, are received within the corresponding contact openings 208 of the control circuit board 112 such that the mating beams extend below the lower surface 206 of the control circuit board 112. For example, the mating interfaces 820 of the mating beams 814 are positioned below the lower surface 206 of the control circuit board 112.

The socket 811 of the receptacle contact 805 receives the fixture contact 710. The mating end 728 of the fixture contact 710 has a body 729 including sidewalls 731 having interior surfaces 732 and exterior surfaces 734. In the illustrated embodiment, the body 729 includes three sidewalls 731 formed as a single, unitary component. Alternatively, the sidewalls 731 may be discreet components. The receptacle contact 805 is electrically connected to the mating end 728 of a fixture contact 710 by the mating interfaces 820 of the mating beams 814 interfering with the interior surfaces 732 of the mating end 728. The mating end 728 moves the mating beams 814 such that the interior surfaces 732 of the mating end 728 flex the mating beams 814 in a direction opposite the radial direction G when the receptacle contact 805 receives the fixture contact 710. For example, the interior surfaces 732 move (e.g., transfer) the mating beams 814 towards each other when the receptacle contact 805 receives the fixture contact 710. Additionally, when the mating end 728 of the fixture contact 710 is removed from the receptacle contact 805, the mating beams 814 rotate in the radial direction G and return to the relaxed state.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A light sensor assembly comprising:
a base assembly configured to be fixedly mounted to a housing of a light fixture, the base assembly holding fixture contacts configured to be electrically connected to the light fixture;
a photocell module on the base assembly, the photocell module including a control circuit board having an upper surface and a lower surface, the control circuit board including contact openings therethrough and conductors associated with corresponding openings, the photocell module having a photocell electrically connected to the control circuit board;
receptacle contacts received in corresponding contact openings in the control circuit board, each receptacle contact having a socket removably receiving the corresponding fixture contacts, each receptacle contact having a mating interface electrically connected to the corresponding fixture contact, each receptacle contact having a mounting beam terminated to the corresponding conductor of the control circuit board; and
a cover coupled to the base assembly over the photocell module.

2. The light sensor assembly of claim 1, wherein the receptacle contact includes a body including end walls and side walls defining the socket, the mounting beam extending from one of the end walls or one of the side walls.

3. The light sensor assembly of claim 1, further comprising a mating beam extending into the socket, the mating beam defining the mating interface of each receptacle contact.

4. The light sensor assembly of claim 1, the conductor includes first and second solder pads adjacent to the corresponding opening of the conductor, wherein the mounting beam is a first mounting beam configured to be soldered to the first solder pad, each receptacle contact further comprising a second mounting beam configured to be soldered to the second solder pad.

5. The light sensor assembly of claim 1, the conductor includes a solder pad adjacent to the corresponding opening of the conductor, the mounting beam configured to be soldered to solder pad.

6. The light sensor assembly of claim 1, wherein the conductor is provided on the upper surface, the mounting beam extending from a top of the receptacle contact and terminated to the corresponding conductor on the upper surface.

7. The light sensor assembly of claim 1, wherein the conductor is provided on the lower surface, the mounting beam extending from a bottom of the receptacle contact and terminated to the corresponding conductor on the lower surface.

8. The light sensor assembly of claim 1, wherein the mounting beam extends outward away from the socket.

9. The light sensor assembly of claim 1, wherein the receptacle contact includes a body having sidewalls, and end walls, wherein the sidewalls and the end walls extend through the contact opening.

10. The light sensor assembly of claim 1, wherein the mating interface is positioned within the contact opening of the control circuit board.

11. The light sensor assembly of claim 1, wherein the mating interface is positioned below the lower surface of the control circuit board.

12. The light sensor assembly of claim 1, wherein the fixture contact includes split beams at a mating end thereof, the split beams being received in the socket and being configured to be spring biased against the receptacle contact.

13. The light sensor assembly of claim 1, wherein the receptacle contact includes a body having a first side and a second side, the body having a seam at the first side, the body having a protrusion at the second side that extends into the socket, the protrusion defining the mating interface.

14. A light sensor assembly comprising:
a base assembly configured to be fixedly mounted to a housing of a light fixture, the base assembly holding fixture contacts configured to be electrically connected to the light fixture, the fixture contacts having mating ends and terminating ends opposite the mating ends, the terminating ends being configured to be terminated to electrical components of the light fixture;

a photocell module on the base assembly, the photocell module including a control circuit board having an upper surface and a lower surface, the control circuit board including contact openings therethrough and conductors associated with corresponding openings, the conductors having solder pads on the control circuit board, the photocell module having a photocell electrically connected to the control circuit board; and receptacle contacts received in corresponding contact openings in the control circuit board, each receptacle contact having a socket removably receiving the mating end of the corresponding fixture contacts, each receptacle contact having a mating interface electrically connected to the mating end of the corresponding fixture contact, each receptacle contact having a mounting beam soldered to the corresponding solder pad on the control circuit board.

15. The light sensor assembly of claim 14, wherein at least one of the fixture contacts is a twist-lock power contact, the twist-lock power contact having a non-planar surface at the terminating end configured to be rotatably mounted to the light fixture.

16. The light sensor assembly of claim 14, wherein one of the conductors is provided on the upper surface, the mounting beam extending from a top of the receptacle contact and terminated to the corresponding conductor on the upper surface.

17. The light sensor assembly of claim 14, wherein one of the conductors is provided on the lower surface, the mounting beam extending from a bottom of the receptacle contact and terminated to the corresponding conductor on the lower surface.

18. The light sensor assembly of claim 14, wherein the fixture contact includes split beams at the mating end thereof, the split beams being received in the socket and being configured to be spring biased against the receptacle contact.

19. The light sensor assembly of claim 14, wherein the receptacle contact includes a body having a first side and a second side, the body having a seam at the first side, the body having a protrusion at the second side that extends into the socket, the protrusion defining the mating interface.

20. A light sensor assembly comprising:

a base assembly configured to be fixedly mounted to a housing of a light fixture, the base assembly holding fixture contacts configured to be electrically connected to the light fixture, the fixture contacts having mating ends and terminating ends opposite the mating ends, the terminating ends being configured to be terminated to electrical components of the light fixture, wherein at least one of the fixture contacts is a twist-lock power contact, the twist-lock power contact having a non-planar surface at the terminating end configured to be rotatably mounted to the light fixture;

a photocell module on the base assembly, the photocell module including a control circuit board having an upper surface and a lower surface, the control circuit board including contact openings therethrough and conductors associated with corresponding openings, the conductors having solder pads on the control circuit board, the photocell module having a photocell electrically connected to the control circuit board; and receptacle contacts received in corresponding contact openings in the control circuit board, each receptacle contact having a socket removably receiving the mating end of the corresponding fixture contacts, each receptacle contact having a mating interface electrically connected to the mating end of the corresponding fixture contact, each receptacle contact having a mounting beam soldered to the corresponding solder pad on the control circuit board.

* * * * *